US012660684B2

(12) United States Patent
Waidhas et al.

(10) Patent No.: US 12,660,684 B2
(45) Date of Patent: Jun. 16, 2026

(54) PACKAGING ARCHITECTURE WITH THERMALLY CONDUCTIVE INTEGRATED CIRCUIT BRIDGE

(71) Applicant: Intel Corporation, Santa Clara, CA (US)

(72) Inventors: Bernd Waidhas, Pettendorf (DE); Sonja Koller, Bavaria (DE); Jan Proschwitz, Riesa (DE); Eduardo De Mesa, Munich (DE)

(73) Assignee: Intel Corporation

( * ) Notice: Subject to any disclaimer, the term of this patent is extended or adjusted under 35 U.S.C. 154(b) by 271 days.

(21) Appl. No.: 17/698,282

(22) Filed: Mar. 18, 2022

(65) Prior Publication Data

US 2023/0299043 A1 Sep. 21, 2023

(51) Int. Cl.
*H10W 90/00* (2026.01)
*H10W 20/20* (2026.01)
*H10W 74/15* (2026.01)

(52) U.S. Cl.
CPC ........... *H10W 90/00* (2026.01); *H10W 20/20* (2026.01); *H10W 90/701* (2026.01); *H10W 74/15* (2026.01); *H10W 90/724* (2026.01); *H10W 90/726* (2026.01); *H10W 90/732* (2026.01); *H10W 90/734* (2026.01)

(58) Field of Classification Search
CPC .............. H01L 23/481; H01L 23/3677; H01L 23/4981; H01L 23/49816; H01L 23/5383; H01L 23/5385; H01L 25/0652; H01L 25/0655; H01L 24/16; H01L 24/32; H01L 24/73; H10W 90/00; H10W 90/701; H10W 90/724; H10W 90/726; H10W 90/732; H10W 90/734; H10W 20/20; H10W 70/611

See application file for complete search history.

(56) References Cited

U.S. PATENT DOCUMENTS

| | | | | |
|---|---|---|---|---|
| 10,886,228 B2* | 1/2021 | Manusharow | ........ | H01L 23/647 |
| 11,164,818 B2* | 11/2021 | Pietambaram | ...... | H01L 25/0652 |
| 2012/0114966 A1* | 5/2012 | Tuan | ................... | H01L 23/3735 |
| | | | | 428/317.5 |
| 2020/0135692 A1* | 4/2020 | Chen | ....................... | H01L 24/96 |
| 2020/0227377 A1* | 7/2020 | Liff | ......................... | H01L 25/50 |

* cited by examiner

*Primary Examiner* — Khiem D Nguyen
(74) *Attorney, Agent, or Firm* — Akona IP PC

(57) ABSTRACT

Embodiments of a microelectronic assembly comprises a first layer, a second layer and a third layer in a stack; a package substrate in the first layer, the package substrate comprising a metallic via structure; a first integrated circuit (IC) die surrounded by an organic dielectric material in the second layer, the first IC die coupled to the package substrate; a second IC die in the third layer, the second IC die coupled to the first IC die; and a third IC die in the third layer, the third IC die coupled to the first IC die. An electrically conductive pathway in the first IC die electrically couples the third IC die and the second IC die, and the first IC die is coupled to the package substrate with a thermally conductive material in contact with the metallic via structure in the package substrate.

20 Claims, 7 Drawing Sheets

100

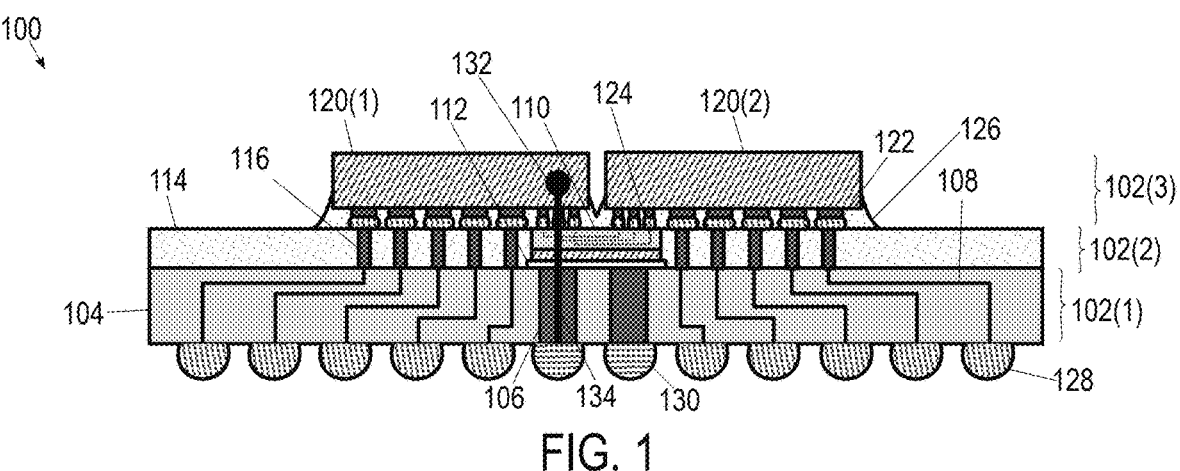
FIG. 1
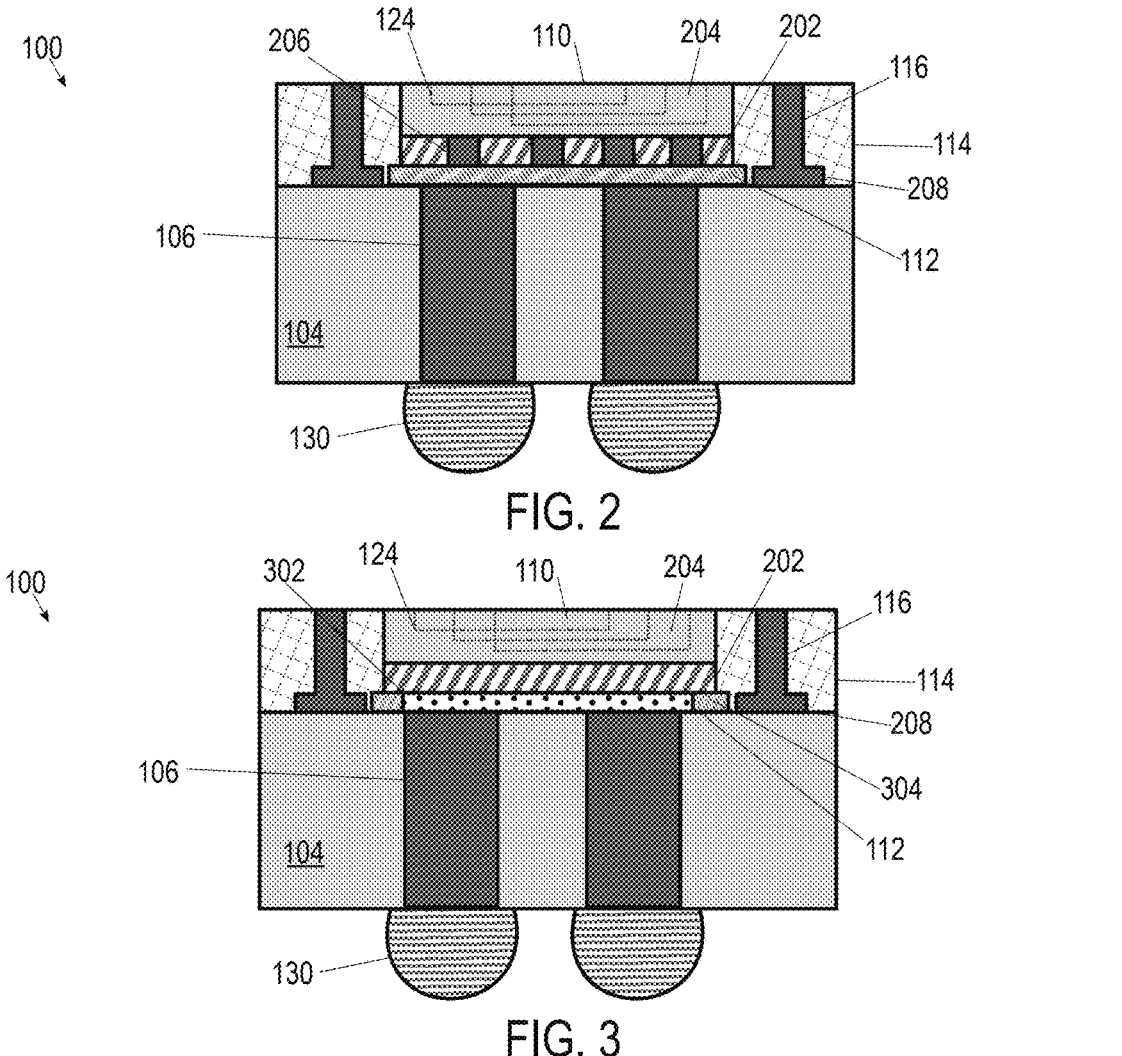
FIG. 2
FIG. 3

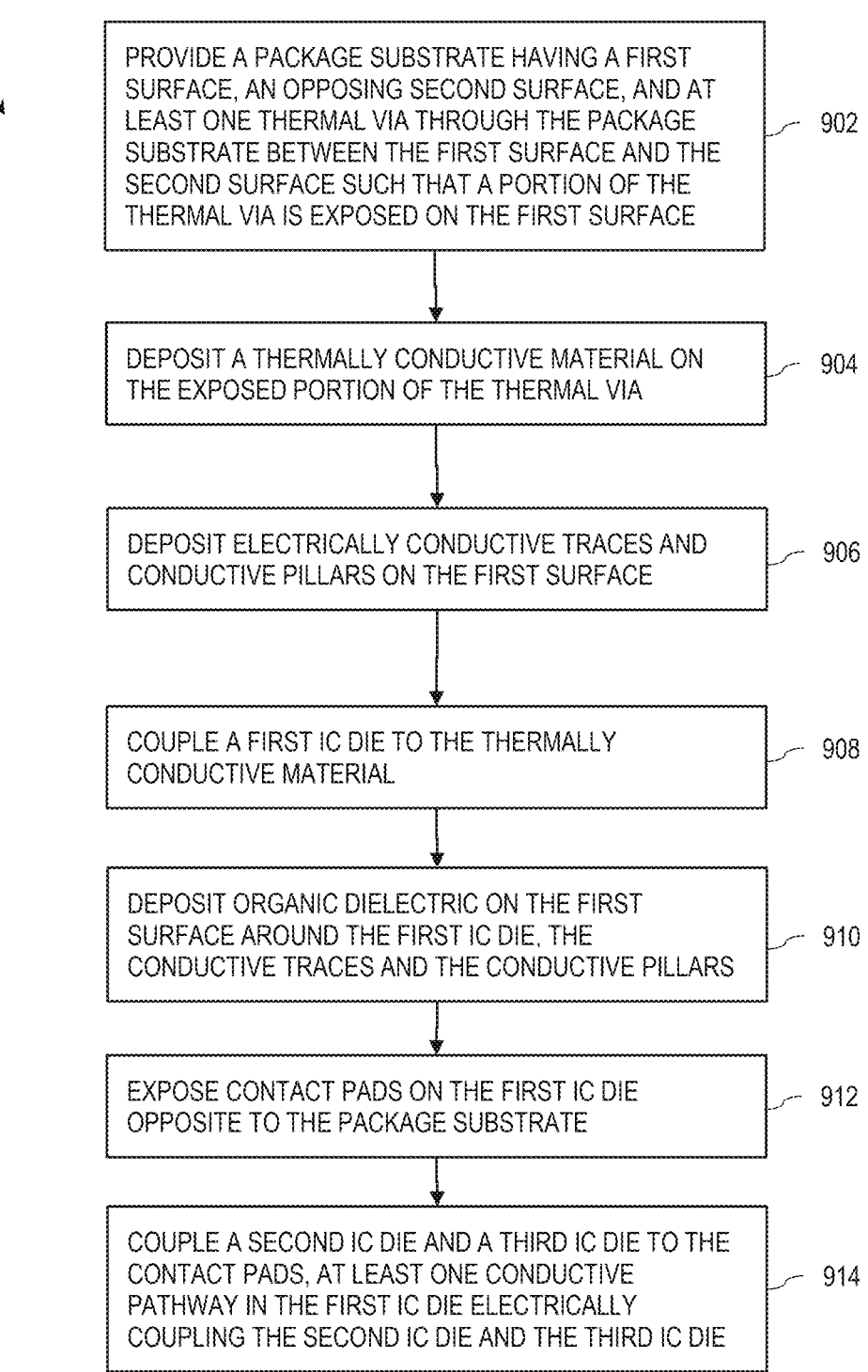

900

PROVIDE A PACKAGE SUBSTRATE HAVING A FIRST SURFACE, AN OPPOSING SECOND SURFACE, AND AT LEAST ONE THERMAL VIA THROUGH THE PACKAGE SUBSTRATE BETWEEN THE FIRST SURFACE AND THE SECOND SURFACE SUCH THAT A PORTION OF THE THERMAL VIA IS EXPOSED ON THE FIRST SURFACE — 902

DEPOSIT A THERMALLY CONDUCTIVE MATERIAL ON THE EXPOSED PORTION OF THE THERMAL VIA — 904

DEPOSIT ELECTRICALLY CONDUCTIVE TRACES AND CONDUCTIVE PILLARS ON THE FIRST SURFACE — 906

COUPLE A FIRST IC DIE TO THE THERMALLY CONDUCTIVE MATERIAL — 908

DEPOSIT ORGANIC DIELECTRIC ON THE FIRST SURFACE AROUND THE FIRST IC DIE, THE CONDUCTIVE TRACES AND THE CONDUCTIVE PILLARS — 910

EXPOSE CONTACT PADS ON THE FIRST IC DIE OPPOSITE TO THE PACKAGE SUBSTRATE — 912

COUPLE A SECOND IC DIE AND A THIRD IC DIE TO THE CONTACT PADS, AT LEAST ONE CONDUCTIVE PATHWAY IN THE FIRST IC DIE ELECTRICALLY COUPLING THE SECOND IC DIE AND THE THIRD IC DIE — 914

FIG. 9

PACKAGING ARCHITECTURE WITH THERMALLY CONDUCTIVE INTEGRATED CIRCUIT BRIDGE

TECHNICAL FIELD

The present disclosure relates to techniques, methods, and apparatus directed to a packaging architecture with a thermally conductive integrated circuit (IC) bridge.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a simplified cross-sectional view of an example microelectronic assembly, according to some embodiments of the present disclosure.

FIG. 2 is a simplified cross-sectional view of a portion of another example microelectronic assembly, according to some embodiments of the present disclosure.

FIG. 3 is a simplified cross-sectional view of a portion of yet another example microelectronic assembly, according to some embodiments of the present disclosure.

FIG. 9 is a flow chart of example operations to manufacture a microelectronic assembly, according to some embodiments of the present disclosure.

DETAILED DESCRIPTION

Overview

Figure 4:
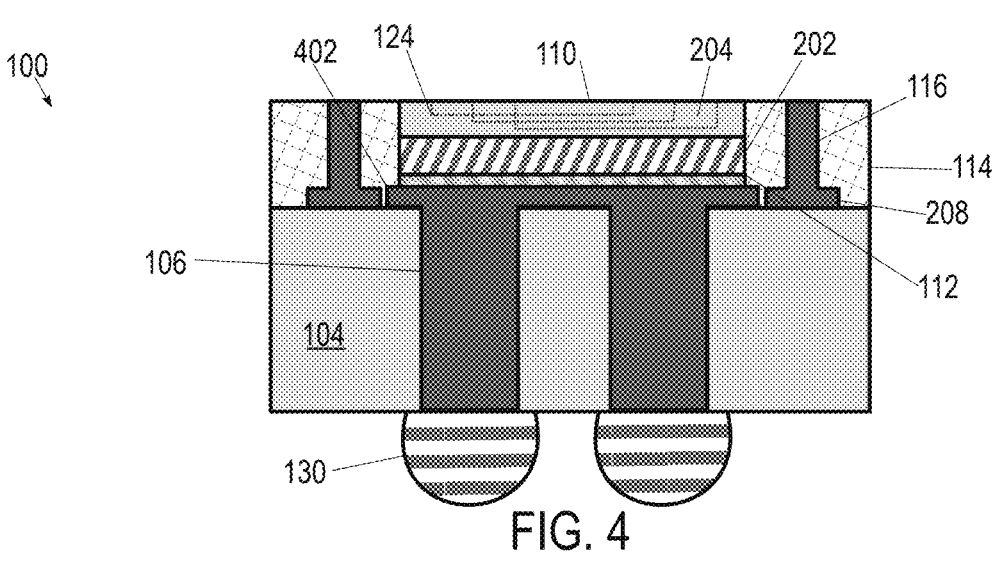
FIG. 4 is a simplified cross-sectional view of a portion of yet another example microelectronic assembly, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

A constant challenge in microelectronics is the need for efficient cooling methods. As power consumed by IC dies increases, so does the heat they generate. At the same time, the form factor of microelectronic assemblies including individual packages are constrained by volume, posing fundamental problems in transferring heat from these IC dies effectively. Various cooling techniques have been based on either passive systems or active systems. Passive systems use bulk materials to conduct heat through microelectronic packages. Historically, the materials chosen for such passive systems include ceramics such as alumina and beryllia, metal alloys such as Kovar Fe/Ni/Co alloy, metal sheets of copper or aluminum, and glass fiber epoxy laminates. Typically, such materials, comprised in the form of heat sinks, for example, are attached directly to the back of IC dies. However, today's electronic systems often exceed the thermal density and mechanical reliability limits of such configurations.

Active systems are typically characterized by forced convection of a coolant (e.g., cooling agent, working fluid), such as air, or a liquid coolant. Fans forcing air to flow around a board or over a metal finned structure in intimate contact with the IC die have been the mainstay of cooling by active systems. Active systems using immersion cooling, spray cooling, and pumped convective cooling in microchannels have been used to a limited extent. The primary difficulty of all the active systems is the requirement for pumping the coolant.

Besides, such existing solutions tend to focus on intimate proximity to the IC die, with passive or active systems being in direct contact, or in direct conductive path, with an unattached surface of the IC die. Yet, in many microelectronic assemblies, the heat producing region of the IC die is proximate to the surface of the IC die attached to the package substrate or printed circuit board (PCB), making existing active and passive systems inefficient at best for cooling hot regions in the IC die, or package substrate (or PCB). Further, any cooling systems mounted on the IC die adds height to the microelectronic assembly, which may be a problem in electronic systems that require a small form factor.

In addition, in assemblies that have multiple tiers of IC dies stacked one on top of another, it may be advantageous to provide additional heat transfer paths than is available with attaching a heat sink to the back of the top tier of IC dies. Consider, for example, a microelectronic assembly comprising: a first layer, a second layer and a third layer in a stack, the second layer between the first layer and the third layer; a package substrate in the first layer, the package substrate having a first side and a second side opposite to the first side, the package substrate comprising a metallic via structure extending between the first side and the second side; a first IC die surrounded by an organic dielectric material in the second layer, the first IC die coupled to the package substrate; a second IC die in the third layer, the second IC die coupled to the first IC die; and a third IC die in the third layer, the third IC die coupled to the first IC die, an electrically conductive pathway in the first IC die electrically coupling the third IC die and the second IC die. Some embodiments of the present disclosure may provide heat transfer pathways in such a microelectronic package by providing at least one thermal via in the package substrate and coupling the first IC die to the package substrate with a thermally conductive material in contact with the thermal via. Such a configuration can enable additional heat paths leading to better device performance because more heat can be extracted, and slim form factors because of low height profile.

Embodiments also provide for a method of fabricating a microelectronic assembly, the method comprising: providing a package substrate having a first surface, an opposing second surface, and at least one thermal via through the package substrate between the first surface and the second surface such that a portion of the thermal via is exposed on the first surface, depositing a thermally conductive material on the exposed portion of the thermal via; depositing electrically conductive traces and conductive pillars on the first surface; coupling a first IC die to the thermally conductive material; depositing organic dielectric on the first surface around the first IC die, the conductive traces and the conductive pillars; exposing contact pads on the first IC die opposite to the package substrate; and coupling a second IC die and a third IC die to the contact pads, wherein at least one conductive pathway in the first IC die electrically couples the second IC die and the third IC die. The method as described in the example embodiment can provide heat transfer paths to carry heat away from the second IC die and the third IC die to and through the package substrate.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a conduit material, a source region and a drain regions provided in and/or over the conduit material, and a gate stack that includes a gate electrode material, alternatively referred to as a "work function" material, provided over a portion of the conduit material (the "conduit portion") between the source and the drain regions, and optionally, also includes a gate dielectric material between the gate electrode material and the conduit material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
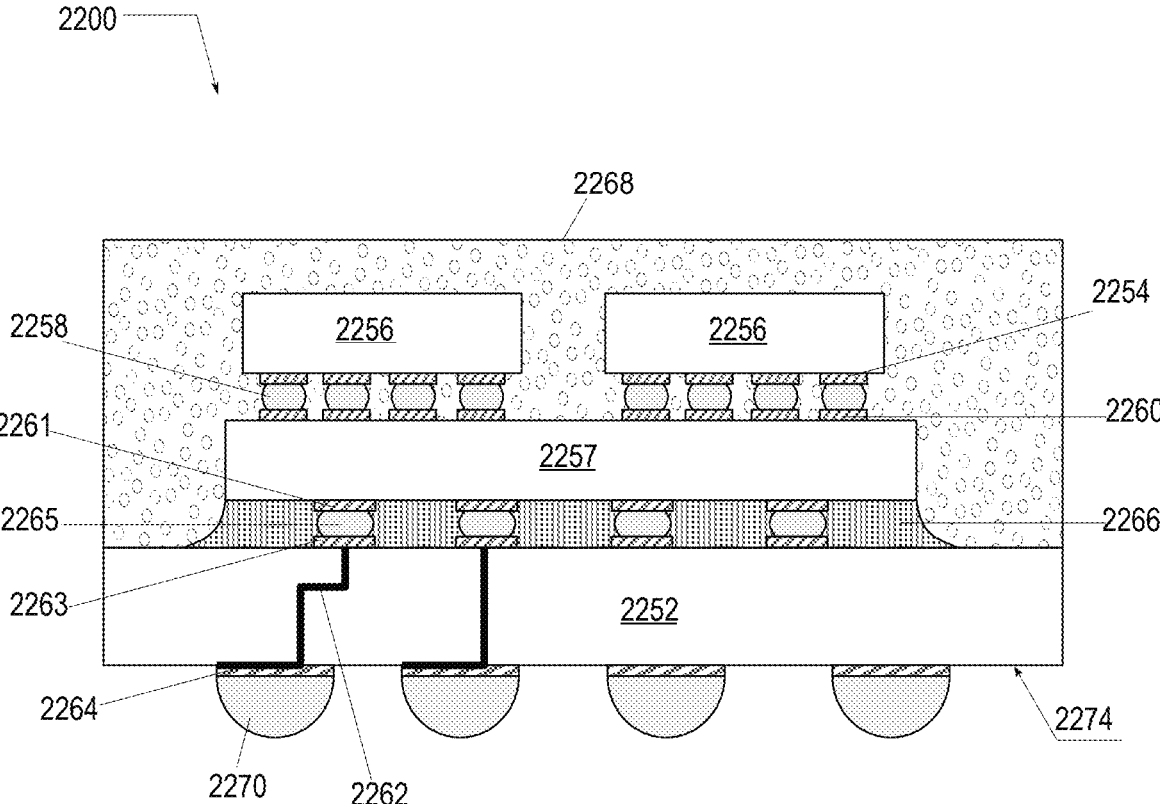
FIG. 10 is a cross-sectional view of a device package that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1 is a simplified cross-sectional view of a microelectronic assembly 100 according to some embodiments of the present disclosure. Microelectronic assembly 100 comprises at least three layers 102: 102(1), 102(2) and 102(3)) in a stack, layer 102(2) between layer 102(1) and 102(3). Note that although only three layers are shown in the figure, microelectronic assembly 100 may comprise any number of additional layers without departing from the scope of the embodiments described herein. A package substrate 104 is in layer 102(1). Package substrate 104 comprises a thermal via 106 extending between two opposing sides of package substrate 104. As used herein, the term "thermal via" refers to a metallic via structure such as a through-hole filled with at least one thermally conductive material. In some embodiments, thermal via 106 may comprise a plated through-hole (e.g., plated with a metal such as copper), and filled with a thermally conductive paste (e.g., silver particles filled polymer, copper and alloy particle paste). In some embodiments, thermal via 106 may comprise a block of copper extending from one side of package substrate 104 to the other in shapes unlike a traditional circular through-hole. In yet other embodiments, thermal via 106 may additionally comprise thermally conductive traces radiating away therefrom, for example, to enable fanning out, or guiding away heat from the thermal via to another external component, such as a heat sink or heat pipe. In some other embodiments, thermal via 106 may comprise a through-hole filled with a single thermally conductive material, e.g., metal. In various embodiments, thermal via 106 may be electrically isolated from electrical circuits in package substrate 104.

Layer 102(2) may comprise an IC die 110 coupled to package substrate 104. A thermally conductive material 112 may be sandwiched between IC die 110 and package substrate 104. Layer 102(2) may further comprise an organic dielectric material 114 surrounding IC die 110. In some embodiments, IC die 110 may comprise only passive components (e.g., resistors, inductors, capacitors, conductive traces, etc.). In some embodiments, IC die 110 may additionally comprise active components (e.g., diodes, transistors, etc.). In various embodiments, organic dielectric material 114 may comprise mold compound, polyimide, or other electrically insulative organic material. Electrically conductive pillars forming through-mold vias (TMVs) 116 may extend through second layer 102(2). TMVs 116 may be disposed around IC die 110. In some embodiments, TMVs 116 may be coupled to landing pads (not shown) on package substrate 104. In various embodiments, TMVs 116 may provide power, signal, and ground connections to components in other layers, such as in layer 102(3).

Other IC dies 120, for example, 120(1) and 120(2) may be provided in layer 102(3) and coupled separately to IC die 110 and/or TMVs 116 by interconnects 122. IC die 110 functions as a high-speed, high-density bridge, providing electrical connectivity between two adjacent IC dies 120(1) and 120(2) at silicon-level pitches, for example, comparable to pitches of conductive traces within metallization layers in any IC die. In some embodiments, interconnects 122 between IC dies 120 and IC die 110 may be arranged with a first pitch between adjacent interconnects; and interconnects 122 between IC dies 120 and TMVs 116 may be arranged with a second pitch between adjacent interconnects, the first pitch being smaller than the second pitch. For example, the first pitch may be between 0.5 microns and 50 microns, whereas the second pitch may be between 20 microns and 150 microns. In some embodiments, interconnects 122 between IC die 120 and IC die 110 may be DTD interconnects, whereas interconnects 122 between IC dies 120 and TMVs 116 may be DTPS interconnects. One or more electrically conductive pathways 124 in IC die 110 may electrically couple IC dies 120(1) and 120(2). In some embodiments, an underfill material 126 may be disposed between IC dies 120 and second layer 102(2), for example, to enable better thermo-mechanical reliability.

In various embodiments, interconnects 128 on a side of package substrate 104 opposite to IC die 110 may enable connection to a PCB (not shown). Thermal vias 106 in package substrate 104 may be coupled to interconnects 130 comprising a subset of interconnects 128. Interconnects 130 may be electrically isolated from other interconnects 128 and from electrical circuits in package substrate 104 (and/or the PCB) in some embodiments.

During operation, IC dies 120(1) and/or 120(2) may produce heat, generating a heat source 132. In the figure, only one heat source 132 is shown, merely for ease of illustration. Heat source 132 may be anywhere in the IC die, for example, closer to the surface, and the specific location shown in the figure is merely for illustrative ease and is not meant to be a limitation. Any number of heat sources may be generated in IC dies 120(1) and/or 120(2) within the broad scope of the embodiments disclosed herein. In various embodiments, microelectronic assembly 100 may facilitate a thermally conductive pathway 134 between heat source 132 and a side of package substrate 104 opposite to IC die 110. Thermally conductive pathway 134 may comprise IC die 110, thermally conductive material 112, and thermal via 106 in some embodiments. In various embodiments, thermally conductive pathway 134 may be provided in addition to other heat transfer pathways in microelectronic assembly 100, for example, comprising thermally conductive lids, heat sinks, and other mechanisms on a side of IC dies 120 opposite to package substrate 104.

FIG. 2 is a simplified cross-sectional view of a portion of another example microelectronic assembly, according to some embodiments of the present disclosure. The figure shows the region proximate to IC die 110 in greater detail. In some embodiments, thermally conductive material 112 may extend across a surface, hereinafter called "backside," of IC die 110 proximate to package substrate 104. Thermally conductive material 112 may function as an adhesive, coupling IC die 110 to package substrate 104 in addition to providing a thermal path in such embodiments. Examples of such thermally conductive material 112 include thermally conductive organic adhesive with filler particles comprising ceramic, or metal particles such as silver particles.

In many embodiments, IC die 110 may comprise a substrate 202 and a metallization stack 204 parallel to and adjacent to substrate 202. In the figure, which is not drawn to scale, metallization stack 204 is shown as similar in scale of thickness to substrate 202; however, in physical realizations, metallization stack 204 may be considerably thinner than substrate 202. Metallization stack may comprise a plurality of layers of interlayer dielectric (ILD) with electrically conductive traces between layers and electrically conductive vias through the layers. In various embodiments, substrate 202 may comprise any suitable material as described in the previous section. In embodiments wherein IC die 110 comprises active components, an active region may be additionally provisioned between metallization stack 204 and substrate 202. Conductive pathways 124 may be disposed in the conductive traces and vias of metallization stack 204.

In some embodiments, IC die 110 may comprise through-substrate vias (TSVs) 206 extending through substrate 202 between the backside of IC die 110 and metallization stack 204. TSVs 206 may be made of a thermally conductive material such as copper having greater thermal conductivity than silicon or the material of substrate 202. TSVs 206 may be electrically isolated from electrical circuits in IC die 110. During operation, heat generated at heat source 132 (not shown) may be transferred through interconnects 122 (not shown), metallization stack 204, TSVs 206, thermally conductive material 112, thermal vias 106, and interconnects 130 to a PCB (not shown).

In some embodiments, TMVs 116 may be coupled to landing pads 208 on package substrate 104. Landing pads 208 may form part of the metallization on the surface of package substrate 104. In many embodiments, landing pads 208 may be larger than TMVs 116 to which they are coupled.

FIG. 3 is a simplified cross-sectional view of a portion of yet another example microelectronic assembly, according to some embodiments of the present disclosure. In some embodiments, thermally conductive material 112 may comprise a non-adhesive thermally conductive material 302 i.e., without adhesive properties and/or with high thermal capacity. For example, non-adhesive thermally conductive material 302 may comprise one or more sheets of graphite. In another example, non-adhesive thermally conductive material 302 may comprise thermal paste, or gel, or a phase-change material that is highly thermally conductive. In yet other embodiments, non-adhesive thermally conductive material 302 may comprise an elastomeric compressive pad with high thermal conductivity. These and other example materials described herein may be similar to some Henkel® or Bergquist® brand thermally conductive materials. In some such embodiments, IC die 110 may be coupled to package substrate 104 with an adhesive material 304, which may or may not be thermally conducting. In the example embodiment shown, adhesive 304 may be disposed in a ring along a periphery of the backside of IC die 110 between IC die 110 and package substrate 104. Non-adhesive thermally conductive material 302 (e.g., graphite) is enclosed within the ring of adhesive 304 and in contact with thermal vias 106.

In some embodiments, as it would be advantageous for the non-adhesive thermally conductive material 302 to make tight contact with the surfaces of IC die 110 and package substrate 104, thermally conductive gap fillers (not shown) may also be included to close any gaps around non-adhesive thermally conductive material 302 and enable an unbroken thermally conductive path between surfaces of IC die 110 and package substrate 104. In some embodiments, such thermal gap fillers may be thixotropic, dispensed in liquid form, enabling it to conform to intricate topographies and multi-level surfaces. In some embodiments, such liquid gap fillers may be provided as a two-component, room or elevated temperature curing systems, enabling a solid, conformal, thermally conductive, form-in-place elastomer after curing. In some other embodiments, such liquid gap fillers may be provided as a single component gel, or thermal grease, or in an elastomeric (i.e., compressible, low elastic modulus material) pad form with adhesive surfaces on either side in some cases. Manual or semi-automatic dispensing tools can be used to apply the liquid thermal gap filling material directly to the target surface of IC die 110 or package substrate 104. Pick-and-place operations can be used to dispense solid (e.g., film or pad) thermal gap fillers and adhesives.

In some embodiments (not shown), the ring of adhesive material 304 may have perforations, opening or other break in continuity so that non-adhesive thermally conductive material 302 may extend through such perforations, openings, or breaks beyond a periphery of IC die 110, enabling a larger area for heat dissipation. During operation, heat generated at heat source 132 (not shown) may be transferred through interconnects 122 (not shown), metallization stack 204, TSVs 206 (if present, otherwise through substrate 202), non-adhesive thermally conductive material 302, thermal vias 106, and interconnects 130 to a PCB (not shown).

FIG. 4 is a simplified cross-sectional view of a portion of yet another example microelectronic assembly, according to some embodiments of the present disclosure. Package substrate 104 may comprise a thermally conductive metal pad 402 on thermal vias 106. Metal pad 402 may be formed as part of the metallization on package substrate 104. In such embodiments, a portion of thermally conductive material 112 may comprise metal pad 402, and another portion (e.g., adhesive material) may be in adhesive contact with metal pad 402. In other words, thermally conductive material(s) between IC die 110 and thermal vias 106 may include an adhesive portion of thermally conductive material 112 and metal pad 402 that forms an inherent part of package substrate 104. In the example embodiment shown, the thickness of metal pad 402 may be the same or similar to the thickness of landing pads 208 of TMVs 116. In some embodiments, metal pad 402 may have a larger footprint than IC die 110, so that it extends beyond the periphery of IC die 110 (e.g., forming a ledge or step around IC die 110). Such a configuration may be advantageous for heat transfer purposes, for example, by providing a larger area for heat transfer. In various embodiments, the material of metal pad 402 may comprise the same material as thermal vias 106, for example, copper.

Figure 5:
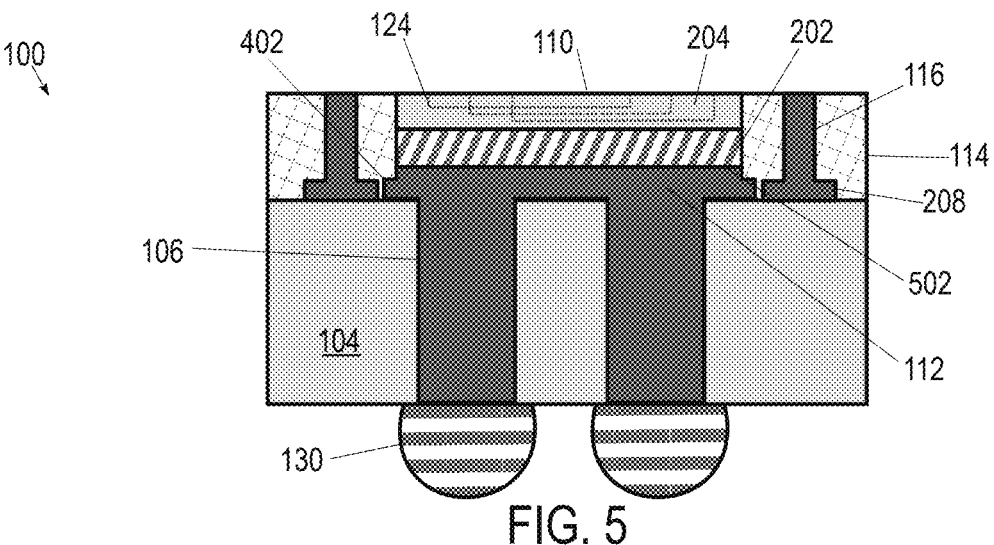
FIG. 5 is a simplified cross-sectional view of a portion of yet another example microelectronic assembly, according to some embodiments of the present disclosure.

FIG. 5 is a simplified cross-sectional view of a portion of yet another example microelectronic assembly, according to some embodiments of the present disclosure. The backside of IC die 110 may comprise a coating 502 of the same material as metal pad 402. IC die 110 may be coupled to metal pad 402 by brazing, soldering, thermo-compression bonding or other metal-to-metal bonding operations such that coating 502 forms a metal-to-metal bond with metal pad 402. In such embodiments, coating 502 may comprise a first portion of thermally conductive material 112 and metal pad 402 may comprise a second portion of thermally conductive material 112.

Figure 6:
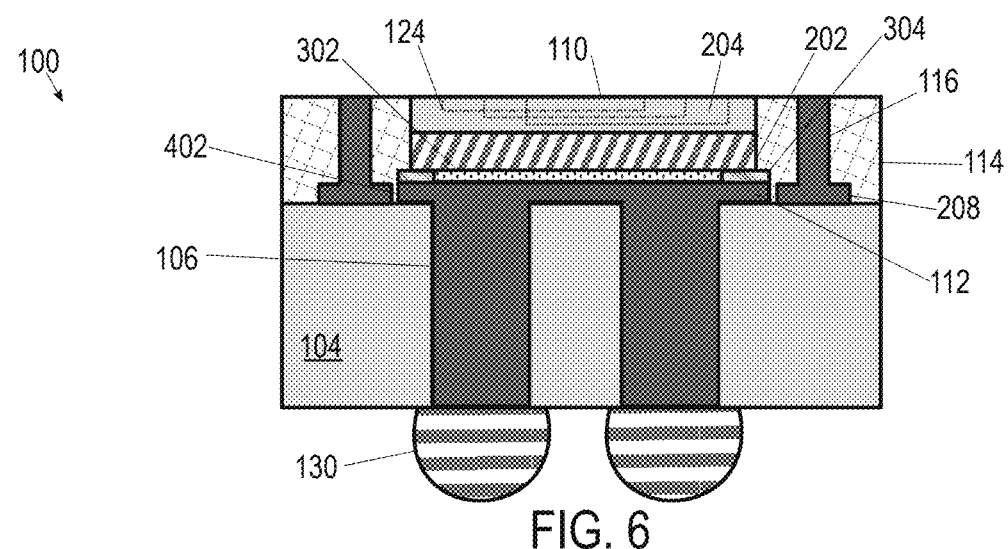
FIG. 6 is a simplified cross-sectional view of a portion of yet another example microelectronic assembly, according to some embodiments of the present disclosure.

FIG. 6 is a simplified cross-sectional view of a portion of yet another example microelectronic assembly, according to some embodiments of the present disclosure. In some embodiments, thermally conductive material 112 may comprise non-adhesive thermally conductive material 302 (e.g., graphite). In some such embodiments, IC die 110 may be coupled to metal pad 402 on package substrate 104 with adhesive material 304, which may or may not be thermally conducting, disposed in a ring along a periphery of the backside of IC die 110. Non-adhesive thermally conductive material 302 (e.g., graphite) is enclosed within the ring of adhesive 304 and in contact with metal pad 402.

Figure 7:
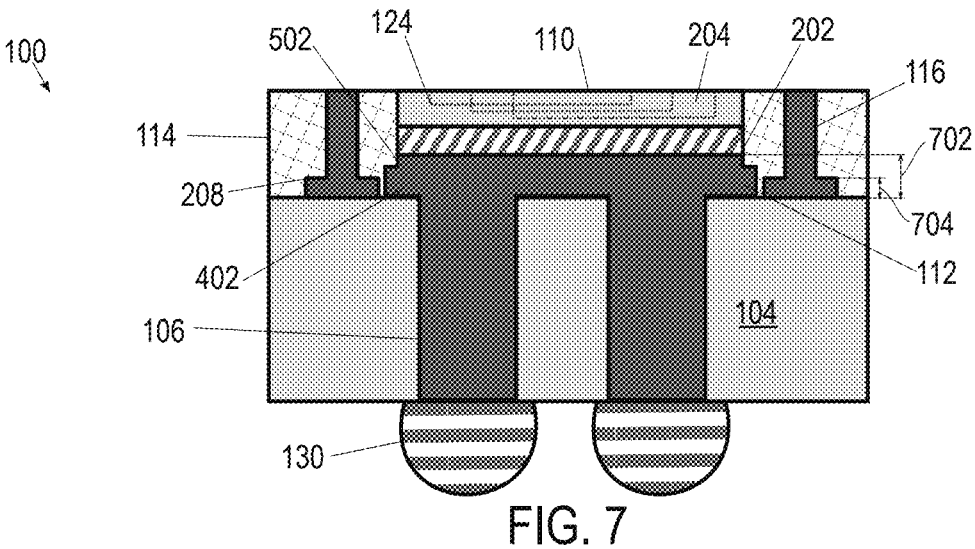
FIG. 7 is a simplified cross-sectional view of a portion of yet another example microelectronic assembly, according to some embodiments of the present disclosure.

FIG. 7 is a simplified cross-sectional view of a portion of yet another example microelectronic assembly, according to some embodiments of the present disclosure. In some embodiments, a total thickness 702 of thermally conductive material 112 may be greater than thickness 704 of landing pads 208. For example, in an embodiment in which microelectronic assembly 100 comprises metal pad 402 in contact with thermal vias 106 as shown in the figure and IC die 110 comprises coating 502, a combined thickness 702 of coating 502 and metal pad 402 may be greater than thickness 704 of landing pads 208. In another embodiment (not shown), for example, similar to the embodiment shown in FIG. 4, the thickness of metal pad 402 alone may be more than thickness 704 of landing pads 208.

Figure 8:
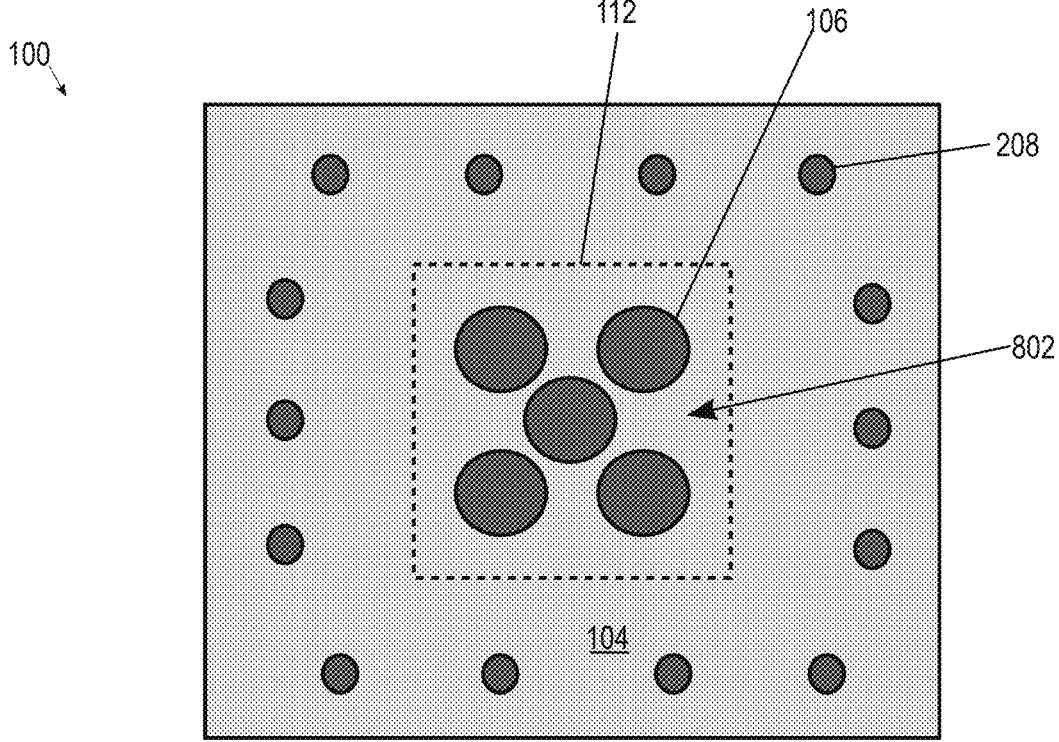
FIG. 8 is a top-view of a portion of yet another example microelectronic assembly, according to some embodiments of the present disclosure.

FIG. 8 is a top-view of a portion of yet another example microelectronic assembly, according to some embodiments of the present disclosure. A boundary of thermally conductive material 112 is shown in dotted lines. Thermal vias 106 may comprise a plurality 802, for example, arranged in an array, contained entirely within the boundary of thermally conductive material 112. Each one of thermal via 106 may have a diameter larger than any TMV 116 or landing pad 208. Plurality 802 may contact thermally conductive material 112 wholly or in parts. Note that landing pads 208 and thermal vias 106 shown are merely for example purposes and are not intended as limitations. Any number of such thermal vias and landing pads and additional traces may be provided in package substrate 104 within the broad scope of the embodiments.

FIG. 9 is a flow chart of example operations to manufacture a microelectronic assembly, according to some embodiments of the present disclosure. At 902, package substrate 104 is provided, package substrate 104 having a first surface, an opposing second surface, and at least one thermal via 106 therethrough between the first surface and the second surface such that a portion of thermal via 106 is exposed on the first surface. In various embodiments, thermal via 106 is electrically isolated from electrical circuits in package substrate 104.

At 904, thermally conductive material 112 is deposited on the exposed portion of thermal via 106. In some embodiments where thermally conductive material 112 comprises metal, such as copper, thermally conductive material 112 may be deposited by electroplating. For example, electrically conductive traces comprising copper may be first deposited on package substrate 104. Additional thermally conductive material 112 may be deposited at desired locations. Conductive pillars are added, for example, by additional electroplating processes.

In some embodiments, depositing thermally conductive material 112 comprises electroplating metal pad 402 over the exposed portion of thermal via 106. In some other embodiments, depositing thermally conductive material 112 comprises applying an adhesive paste or film of thermally conductive material over the exposed portion of thermal via 106. In such embodiments where thermally conductive material 112 comprises adhesive paste or film, electrically conductive traces and pillars are deposited on package substrate 104; subsequently, thermally conductive material 112 is deposited on IC die 110 or on package substrate 104, for example, by pick-and-place of films, or ink deposition of paste, etc.

In some embodiments, depositing thermally conductive material 112 comprises: applying adhesive 304 e.g., in paste or film form, in a ring shape around the exposed portion of thermal via 106, the ring having an inner perimeter and an outer perimeter, and placing a sheet of non-adhesive thermally conductive material 302 (e.g., graphite) within the inner perimeter such that non-adhesive thermally conductive material 302 is in contact with the exposed portion of thermal via 106. In some embodiments where thermally conductive material 112 is in the form of a die attach film, it may be applied on IC die 110 (e.g., in wafer format, before dicing into individual IC dies); in other embodiments where thermally conductive material 112 is in the form of a paste, it may be applied on metal pad 402, or on the surface of package substrate 104 contacting thermal via 106. In some embodiments where non-adhesive thermally conductive material 302 is used in addition to adhesive material 304, thermally conductive gap-filler materials may also be dispensed appropriately (e.g., dispensed in liquid form, or pick-and-place if in solid form, etc.) to fill any gaps between proximate surfaces of IC die 110 and package substrate 104.

At 906, electrically conductive traces (e.g., landing pads 208) and conductive pillars (e.g., TMVs 116) are deposited on the first surface. In some embodiments having metal pad 402 on thermal vias 106, the electrically conductive traces may be formed at the same time as metal pad 402. In some such embodiments, after depositing electrically conductive traces including landing pads 208, another plating or deposition step is carried out, wherein some portions of the conductive pillars and additional metal on metal pad 402 are deposited such that metal pad 402 is thicker than landing pads 208. Note that the sequence as shown in the figure may be changed so that some operations as described may be performed before others that precede it in the figure without departing from the scope of the present disclosure. For example, in some embodiments where thermally conductive material 112 is not applied at 904, it may be applied at this stage, after operation 906.

At 908, IC die 110 is coupled to thermally conductive material 112. In some embodiments having metal pad 402 on thermal vias 106, coupling IC die 110 to thermally conductive material 112 comprises plating the backside of IC die 110 with coating 502 of the thermally conductive material of the metal pad, for example, copper, and attaching the plated side having coating 502 to metal pad 402. Attaching plated side having coating 502 comprises at least one of soldering, brazing and thermo-compression bonding in various embodiments. In some other embodiments having metal pad 402 on thermal vias 106, coupling IC die 110 to thermally conductive material 112 comprises: applying an adhesive paste or film of thermally conductive material on the backside of IC die 110, and gluing the backside of IC die 110 to metal pad 402.

In some embodiments where thermally conductive material 112 has adhesive properties, coupling IC die 110 to thermally conductive material 112 merely comprises attaching IC die 110 to thermally conductive material 112. In some embodiments having adhesive material 304 and non-adhesive thermally conductive material 302 in thermally conductive material 112, coupling IC die 110 to thermally conductive material 112 comprises attaching IC die 110 to adhesive 304 such that non-adhesive thermally conductive material 302 (e.g., graphite) is between IC die 110 and thermal via 106. Additional operations, such as curing of adhesives, gap-filler materials, etc. may also be included in these operations.

At 910, organic dielectric material 114 is deposited on the first surface around IC die 110, the conductive traces and the conductive pillars. At 912, contact pads on IC die 110 opposite to package substrate 104 are exposed. At 914, IC dies 120(1) and 120(2) are coupled to the contact pads with interconnects 122. At least one conductive pathway in IC die 110 electrically couples IC dies 120(1) and 120(2) by way of interconnects 122.

In some embodiments, the method further comprises exposing a surface of the conductive pillars on a side of organic dielectric material 114 opposite to package substrate 104, and coupling IC dies 120(1) and 120(2) to the exposed surfaces of the conductive pillars. In some such embodiments, IC dies 120 are coupled to IC die 110 with interconnects 122 having a first pitch, and to the conductive pillars with interconnects 122 having a second pitch, the first pitch being smaller than the second pitch. In various embodiments, coupling of IC dies 120 to IC die 110 and the conductive pillars may be achieved in a single operation (e.g., solder reflow). In some embodiments, the method further comprises coupling a PCB to interconnects 128 of package substrate 104 on a side of package substrate 104 opposite to IC die 110, at least one interconnect 130 being in contact with thermal via 106 and electrically isolated from other interconnects 128.

In various embodiments, any of the features discussed with reference to any of FIGS. 1-9 herein may be combined with any other features to form a package with one or more IC dies as described herein, for example, to form a modified microelectronic assembly 100. Some such combinations are described above, but, in various embodiments, further combinations and modifications are possible.

Although the operations of the method 900 are illustrated in FIG. 9 once each and in a particular order, the operations may be performed in any suitable order and repeated as desired. For example, one or more operations may be performed in parallel to manufacture multiple microelectronic packages substantially simultaneously. In another example, the operations may be performed in a different order to reflect the structure of a particular microelectronic package in which one or more IC dies 110 as described herein may be included.

Furthermore, the operations illustrated in FIG. 9 may be combined or may include more details than described. Still further, method 900 shown in FIG. 9 may further include other manufacturing operations related to fabrication of other components of the microelectronic assemblies described herein, or any devices that may include the microelectronic assemblies as described herein. For example, method 900 may include various cleaning operations, surface planarization operations (e.g., using chemical mechanical polishing), operations for surface roughening, operations to include barrier and/or adhesion layers as desired, and/or operations for incorporating the microelectronic assembly and other IC dies not mentioned or described herein in, or with, an IC component, a computing device, or any desired structure or device.

Example Devices and Components

Figure 11:
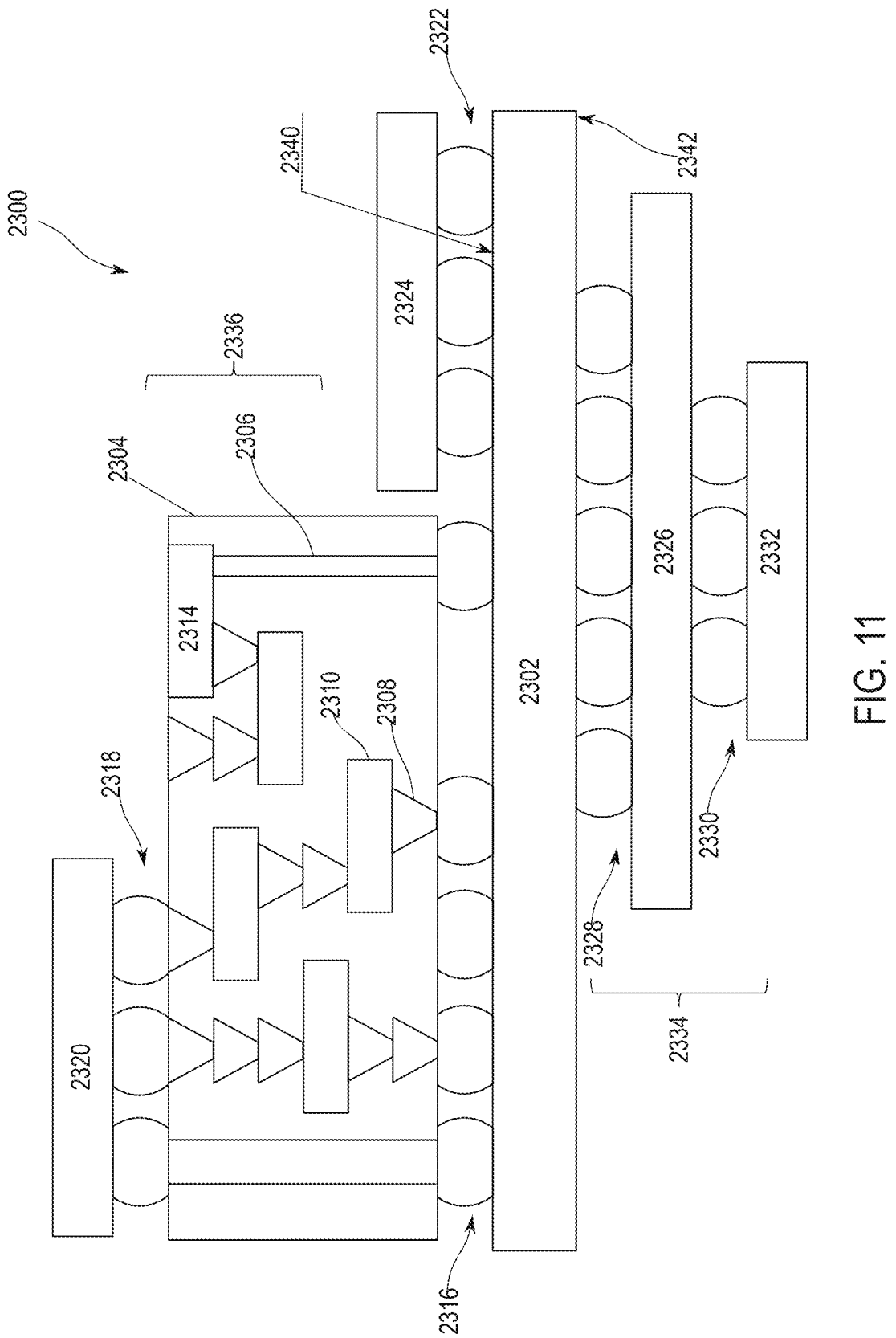
FIG. 11 is a cross-sectional side view of a device assembly that includes one or more microelectronic assemblies in accordance with any of the embodiments disclosed herein.
Figure 12:
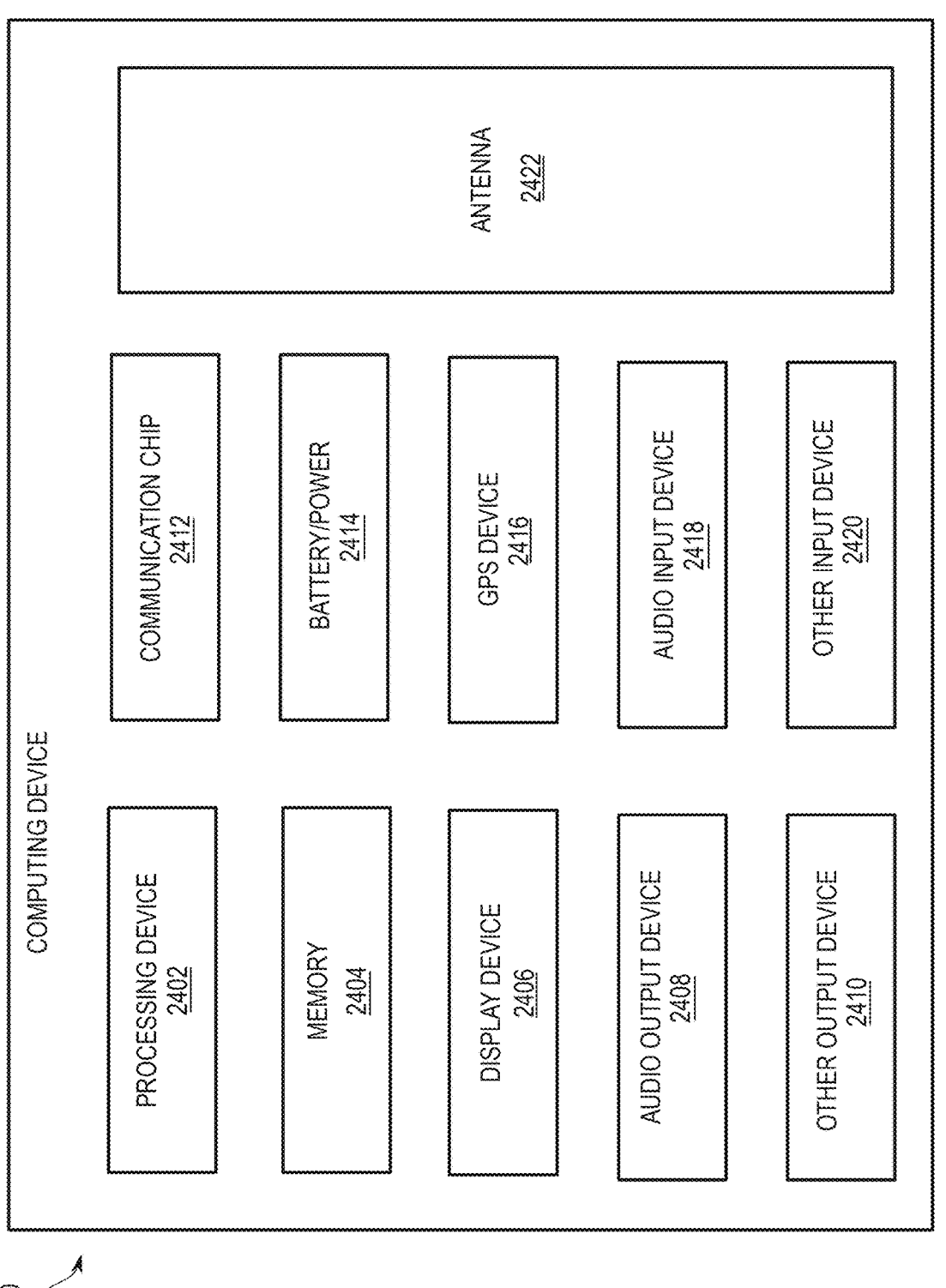
FIG. 12 is a block diagram of an example computing device that includes one or more microelectronic assemblies in accordance with any of the embodiments disclosed herein.

The packages disclosed herein, e.g., any of the embodiments shown in FIGS. 1-9 or any further embodiments described herein, may be included in any suitable electronic component. FIGS. 10-12 illustrate various examples of packages, assemblies, and devices that may be used with or include any of the IC packages as disclosed herein.

FIG. 10 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 11.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 11 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 10.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 10. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio-frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 12 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 10). In yet another example, any one or more of the components of computing device 2400 may include an IC device assembly 2300 (e.g., as shown in FIG. 11).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, crypto-processors (specialized processors that execute crypto-graphic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio-frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly (e.g., 100, FIG. 1), comprising: a first layer (e.g., 102(1)), a second layer (e.g., 102(2)), and a third layer (e.g., 102(3)) in a stack, the second layer between the first layer and the third layer; a package substrate (e.g., 104) in the first layer, the package substrate having a first side and a second side opposite to the first side, the package substrate comprising a metallic via structure (e.g., 106) extending between the first side and the second side; a first IC die (e.g., 110) surrounded by an organic dielectric material (e.g., 114) in the second layer, the first IC die coupled to the package substrate; a second IC die (e.g., 120 (1)) in the third layer, the second IC die coupled to the first IC die; and a third IC die (e.g., 120(2)) in the third layer, the third IC die coupled to the first IC die. An electrically conductive pathway (e.g., 124) in the first IC die electrically couples the third IC die and the second IC die, and the first IC die is coupled to the package substrate with a thermally conductive material (e.g., 112) in contact with the thermal via in the package substrate.

Example 2 provides the microelectronic assembly of example 1, in which the metallic via structure is electrically isolated from electrical circuits in the package substrate.

Example 3 provides the microelectronic assembly of any one of examples 1-2, in which the thermally conductive material comprises thermally conductive organic adhesive with filler particles comprising ceramic (e.g., FIG. 2).

Example 4 provides the microelectronic assembly of any one of examples 1-2, in which the thermally conductive material comprises graphite.

Example 5 provides the microelectronic assembly of example 4, in which the graphite (e.g., 302) is enclosed within a ring (e.g., 304) of adhesive material between the first IC die and the package substrate (e.g., FIG. 3). In some embodiments, the graphite extends through an opening in the ring beyond a perimeter of the first IC die. In some embodiments, the thermally conductive material comprises a gap-filler material that contacts proximate surfaces of the first IC die and the package substrate.

Example 6 provides the microelectronic assembly of any one of examples 1-2, in which the thermally conductive material comprises copper (e.g., 402, FIG. 4).

Example 7 provides the microelectronic assembly of any one of examples 1-6, in which the thermally conductive material extends beyond a boundary of the first IC die (e.g., FIG. 4).

Example 8 provides the microelectronic assembly of any one of examples 1-7, in which the thermally conductive material comprises a plurality of materials with different thermal conductivities (e.g., FIGS. 3-4).

Example 9 provides the microelectronic assembly of any one of examples 1-8, in which a surface of the first IC die in contact with the thermally conductive material comprises a coating of copper (e.g., 502, FIG. 5).

Example 10 provides the microelectronic assembly of any one of examples 1-9, further comprising TMVs (e.g., 116) through the organic dielectric material.

Example 11 provides the microelectronic assembly of example 10, in which the metallic via structure has a larger diameter than the largest of the TMVs.

Example 12 provides the microelectronic assembly of any one of examples 10-11, in which the TMVs are attached to landing pads (e.g., 206) on the package substrate.

Example 13 provides the microelectronic assembly of example 12, in which the thermally conductive material is thicker than the landing pads (e.g., FIG. 7).

Example 14 provides the microelectronic assembly of any one of examples 1-13, in which the package substrate comprises a plurality (e.g., 802) of metallic via structures parallel to the metallic via structure and in contact with the thermally conductive material (e.g., FIG. 8).

Example 15 provides the microelectronic assembly of any one of examples 1-14, in which: the metallic via structure is coupled to a thermally conductive interconnect (e.g., 130) on the second side of the package substrate opposite to the first IC die, and the thermally conductive interconnect is not connected to any electrical pathway.

Example 16 provides the microelectronic assembly of any one of examples 1-15, in which (e.g., FIG. 5): the thermally conductive material comprises a first portion (e.g., 502) and a second portion (e.g., 402), the first portion is part of the first IC die, and the second portion is part of the package substrate.

Example 17 provides the microelectronic assembly of any one of examples 1-16, in which the organic dielectric material comprises mold compound.

Example 18 provides the microelectronic assembly of any one of examples 1-17, in which (e.g., FIG. 1): at least one of the second IC die and the third IC die comprises a heat source (e.g., 132), and a thermally conductive pathway (e.g., 134) between the heat source and a side of the package substrate opposite to the first IC die comprises the first IC die, the thermally conductive material, and the metallic via structure.

Example 19 provides the microelectronic assembly of any one of examples 1-18, in which the first IC die comprises thermal TSVs (e.g., 206) electrically isolated from electrical circuits in the first IC die.

Example 20 provides the microelectronic assembly of any one of examples 1-19, in which the package substrate is coupled to a PCB opposite to the first IC die.

Example 21 provides the microelectronic assembly of any one of examples 1-20, in which: the first IC die is coupled to the second IC die and the third IC die with interconnects (e.g., 122) having a first pitch, and the second IC die and the third IC die are coupled to a portion of the second layer by interconnects having a second pitch, in which the first pitch is smaller than the second pitch.

Example 22 provides an IC die (e.g., 110), comprising: a substrate (e.g., 202); and a metallization stack (e.g., 204) parallel and adjacent to the substrate, in which: the metallization stack comprises electrically conductive pathways (e.g., 124), a first side of the IC proximate to the metallization stack is coupled to at least two other IC dies (e.g., 120(1) and 120(2)) by DTD interconnects (e.g., 122), a second side of the IC die opposite to the first side is coupled to a package substrate (e.g., 104) having thermal vias (e.g., 106) extending through a thickness of the package substrate, the IC die is surrounded on its remaining sides by an organic dielectric material, and a thermally conductive material (e.g., 112) is between the second side of the IC die and the package substrate and in contact with the thermal vias.

Example 23 provides the IC die of example 22, further comprising TSVs (e.g., 206) in the substrate, in which: the TSVs comprise thermally conductive material, and the TSVs are electrically isolated from electrical circuits in the IC die.

Example 24 provides the IC die of any one of examples 22-23, in which the at least two other IC dies are electrically coupled by the DTD interconnects and the electrically conductive pathways.

Example 25 provides the IC die of any one of examples 22-24, in which: the thermal vias are coupled to interconnects on a side of the package substrate opposite to the IC die, and the interconnects are electrically isolated in the package substrate.

Example 26 provides the IC die of any one of examples 22-25, in which the package substrate comprises a thermally conductive pad (e.g., 402) in contact with the thermal vias.

Example 27 provides the IC die of example 26, in which the thermally conductive pad has a larger footprint than the IC die.

Example 28 provides the IC die of any one of examples 26-27, in which the thermally conductive pad is thicker than conductive traces on the package substrate.

Example 29 provides the IC die of any one of examples 26-28, in which: the thermally conductive pad comprises a metal, the second side of the IC die comprises a coating of the metal, and the thermally conductive pad is attached to the coating.

Example 30 provides the IC die of any one of examples 26-28, in which: the second side of the IC die comprises a coating of adhesive material, and the IC die is attached to the thermally conductive pad by the adhesive material.

Example 31 provides the IC die of any one of examples 26-28, in which: the thermally conductive material comprises graphite and an adhesive material between the second surface of the IC die and the thermally conductive pad, the IC die is attached to the thermally conductive pad by the adhesive material, the adhesive material forms a ring along a periphery of the IC die, and the graphite is enclosed within the ring of the adhesive material.

Example 32 provides the IC die of any one of examples 22-25, in which: the thermally conductive material comprises graphite and an adhesive material, the IC die is attached to the package substrate by the adhesive material, the adhesive material forms a ring along a periphery of the IC die, and the graphite is enclosed within the ring of the adhesive material.

Example 33 provides a method (e.g., 900, FIG. 9) for fabricating a microelectronic assembly, the method comprising: providing a package substrate having a first surface, an opposing second surface, and at least one thermal via through the package substrate between the first surface and the second surface such that a portion of the thermal via is exposed on the first surface (e.g., 902); depositing a thermally conductive material on the exposed portion of the thermal via (e.g., 904); depositing electrically conductive traces and conductive pillars on the first surface (e.g., 906);

coupling a first IC die to the thermally conductive material (e.g., 908); depositing organic dielectric on the first surface around the first IC die, the conductive traces and the conductive pillars (e.g., 910); exposing contact pads on the first IC die opposite to the package substrate (e.g., 912); and coupling a second IC die and a third IC die to the contact pads, in which at least one conductive pathway in the first IC die electrically couples the second IC die and the third IC die (e.g., 914).

Example 34 provides the method of example 33, in which the thermal via is electrically isolated from electrical circuits in the package substrate.

Example 35 provides the method of any one of examples 33-34, in which depositing the thermally conductive material comprises electroplating a metal pad over the exposed portion of the thermal via.

Example 36 provides the method of example 35, in which coupling the first IC die to the thermally conductive material comprises: plating a side of the first IC die with the thermally conductive material of the metal pad, and attaching the plated side of the first IC die to the metal pad.

Example 37 provides the method of example 36, in which attaching the plated side comprises at least one of soldering, brazing and thermo-compression bonding.

Example 38 provides the method of any one of examples 35-37, in which, after depositing electrically conductive traces and conductive pillars on the first surface, additional thermally conductive material is deposited over the metal pad such that the thermally conductive material is thicker than the electrically conductive traces.

Example 39 provides the method of example 35, in which coupling the first IC die to the thermally conductive material comprises: applying an adhesive film of thermally conductive material on a side of the first IC die, and gluing the side of the first IC die to the metal pad.

Example 40 provides the method of example 35, in which coupling the first IC die to the thermally conductive material comprises: applying an adhesive paste of thermally conductive material on the metal pad, and gluing the first IC die to the metal pad.

Example 41 provides the method of example 33, in which depositing the thermally conductive material comprises applying an adhesive paste or film of thermally conductive material over the exposed portion of the thermal via.

Example 42 provides the method of example 41, in which coupling the first IC die to the thermally conductive material comprises attaching the first IC die to the adhesive paste or film.

Example 43 provides the method of example 33, in which depositing the thermally conductive material comprises: applying an adhesive paste or film in a shape of a ring around the exposed portion of the thermal via, the ring having an inner perimeter and an outer perimeter; and placing a sheet of graphite within the inner perimeter such that the graphite is in contact with the exposed portion of the thermal via.

Example 44 provides the method of example 43, in which coupling the first IC die to the thermally conductive material comprises attaching the first IC die to the adhesive paste or film such that the graphite is between the first IC die and the thermal via.

Example 45 provides the method of any one of examples 33-44, further comprising: exposing a surface of the conductive pillars on a side of the organic dielectric opposite to the package substrate; and coupling the second IC die and the third IC die to the exposed surfaces of the conductive pillars, in which: the second IC die and the third IC die are coupled to the first IC die with first interconnects of a first pitch between adjacent first interconnects, the second IC die and the third IC die are coupled to the conductive pillars with second interconnects of a second pitch between adjacent second interconnects, and the first pitch is smaller than the second pitch.

Example 46 provides the method of any one of examples 33-45, further comprising coupling a PCB to interconnects of the package substrate, in which: the interconnects are on a side of the package substrate opposite to the first IC die, at least one interconnect is in contact with the thermal via, and the at least one interconnect is electrically isolated from other interconnects.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a first layer, a second layer, and a third layer in a stack, the second layer between the first layer and the third layer;
a package substrate in the first layer, the package substrate having a first side and a second side opposite to the first side, the package substrate comprising a metallic via structure extending between the first side and the second side of the package substrate;
a first integrated circuit (IC) die surrounded by an organic dielectric material in the second layer, the first IC die coupled to the package substrate;
a second IC die in the third layer, the second IC die coupled to the first IC die; and
a third IC die in the third layer, the third IC die coupled to the first IC die,
wherein:
an electrically conductive pathway in the first IC die electrically couples the third IC die and the second IC die, and
the first IC die is coupled to the package substrate with a thermally conductive material in contact with the metallic via structure in the package substrate, wherein the thermally conductive material comprises graphite and the graphite is enclosed within a ring of adhesive material between the first IC die and the package substrate.

2. The microelectronic assembly of claim 1, wherein the metallic via structure is electrically isolated from electrical circuits in the package substrate.

3. The microelectronic assembly of claim 1, wherein a surface of the first IC die in contact with the thermally conductive material comprises a coating of copper.

4. The microelectronic assembly of claim 1, wherein:
the metallic via structure is coupled to a thermally conductive interconnect on a surface of the package substrate opposite to the first IC die, and
the thermally conductive interconnect is not connected to any electrical pathway.

5. The microelectronic assembly of claim 1, wherein the package substrate is coupled to a printed circuit board (PCB) opposite to the first IC die.

6. The microelectronic assembly of claim 1, wherein the graphite extends through an opening in the ring beyond a perimeter of the first IC die.

7. The microelectronic assembly of claim 1, wherein the thermally conductive material extends beyond a boundary of the first IC die.

8. The microelectronic assembly of claim 1, wherein the organic dielectric material comprises mold compound.

9. The microelectronic assembly of claim 1, further comprising:

through-mold vias (TMVs) through the organic dielectric material.

10. The microelectronic assembly of claim 9, wherein the metallic via structure has a larger diameter than the TMVs.

11. An IC die, comprising:

a substrate; and a metallization stack parallel and adjacent to the substrate, wherein:

the metallization stack comprises electrically conductive pathways, a first side of the IC die proximate to the metallization stack is coupled to at least two other IC dies by die-to-die (DTD) interconnects, a second side of the IC die opposite to the first side is coupled to a package substrate having thermal vias extending through a thickness of the package substrate, the IC die is surrounded on its remaining sides by an organic dielectric material, and a thermally conductive material is between the second side of the IC die and the package substrate and in contact with the thermal vias, wherein:

the thermally conductive material comprises graphite and an adhesive material, the IC die is attached to the package substrate by the adhesive material, the adhesive material forms a ring along a periphery of the IC die, and the graphite is enclosed within the ring of the adhesive material.

12. The IC die of claim 11, wherein the thermally conductive material is a first thermally conductive material, and the IC die further comprising:

through-substrate vias (TSVs) in the substrate, wherein:

the TSVs comprise a second thermally conductive material different than the first thermally conductive material, and the TSVs are electrically isolated from electrical circuits in the IC die.

13. The IC die of claim 11, wherein the at least two other IC dies are electrically coupled by the DTD interconnects and the electrically conductive pathways.

14. The IC die of claim 11, wherein the package substrate comprises a thermally conductive pad in contact with the thermal vias.

15. The IC die of claim 14, wherein:

the thermally conductive pad comprises a metal, the second side of the IC die comprises a coating of the metal, and the thermally conductive pad is attached to the coating.

16. The IC die of claim 12, wherein the second thermally conductive material comprises copper.

17. A method for fabricating a microelectronic assembly, the method comprising:

providing a package substrate having a first surface, an opposing second surface, and at least one thermal via through the package substrate between the first surface and the second surface such that a portion of the thermal via is exposed on the first surface;

depositing a thermally conductive material on the exposed portion of the thermal via, wherein depositing the thermally conductive material comprises:

applying an adhesive paste or film in a shape of a ring around the exposed portion of the thermal via, the ring having an inner perimeter and an outer perimeter; and placing a sheet of graphite within the inner perimeter such that the graphite is in contact with the exposed portion of the thermal via;

depositing electrically conductive traces and conductive pillars on the first surface;

coupling a first IC die to the thermally conductive material;

depositing an organic dielectric on the first surface around the first IC die, the conductive traces and the conductive pillars;

exposing contact pads on the first IC die opposite to the package substrate; and coupling a second IC die and a third IC die to the contact pads, wherein at least one conductive pathway in the first IC die electrically couples the second IC die and the third IC die.

18. The method of claim 17, further comprising:

exposing a surface of the conductive pillars on a side of the organic dielectric opposite to the package substrate; and coupling the second IC die and the third IC die to the exposed surfaces of the conductive pillars, wherein:

the second IC die and the third IC die are coupled to the first IC die with first interconnects of a first pitch between adjacent first interconnects, the second IC die and the third IC die are coupled to the conductive pillars with second interconnects of a second pitch between adjacent second interconnects, and the first pitch is smaller than the second pitch.

19. The method of claim 17, wherein coupling the first IC die to the thermally conductive material comprises:

attaching the first IC die to the adhesive paste or film such that the graphite is between the first IC die and the thermal via.

20. The method of claim 17, further comprising:

coupling a printed circuit board (PCB) to interconnects of the package substrate, wherein the interconnects are on a side of the package substrate opposite to the first IC die, at least one interconnect is in contact with the thermal via, and the at least one interconnect is electrically isolated from other interconnects.

* * * * *